(12) United States Patent
Chun

(10) Patent No.: US 7,003,703 B2
(45) Date of Patent: Feb. 21, 2006

(54) METHOD OF INTERLEAVING/DEINTERLEAVING IN A COMMUNICATION SYSTEM

(75) Inventor: Joon-Hwa Chun, Lake Grove, NY (US)

(73) Assignee: Sandbridge Technologies, Inc., White Plains, NY (US)

( * ) Notice: Subject to any disclaimer, the term of this patent is extended or adjusted under 35 U.S.C. 154(b) by 520 days.

(21) Appl. No.: 10/175,852

(22) Filed: Jun. 21, 2002

(65) Prior Publication Data

US 2003/0237030 A1   Dec. 25, 2003

(51) Int. Cl.
*G06F 11/00* (2006.01)

(52) U.S. Cl. .................. 714/701; 714/752; 370/441

(58) Field of Classification Search ............. 714/701, 714/746, 752, 756
See application file for complete search history.

(56) References Cited

U.S. PATENT DOCUMENTS

| | | | |
|---|---|---|---|
| 5,263,051 A * | 11/1993 | Eyuboglu | 375/254 |
| 5,754,783 A | 5/1998 | Mendelson et al. | |
| 5,889,791 A | 3/1999 | Yang | |
| 6,041,393 A | 3/2000 | Hsu | |
| 6,205,190 B1 | 3/2001 | Antonio et al. | |
| 6,351,456 B1 | 2/2002 | Struhsaker et al. | |
| 6,744,744 B1 * | 6/2004 | Tong et al. | 370/320 |
| 6,854,077 B1 * | 2/2005 | Chen et al. | 714/702 |
| 2003/0023909 A1 * | 1/2003 | Ikeda et al. | 714/702 |
| 2003/0079170 A1 * | 4/2003 | Stewart et al. | 714/755 |
| 2003/0221084 A1 * | 11/2003 | Zhou | 711/209 |

* cited by examiner

Primary Examiner—Albert Decady
Assistant Examiner—John P. Trimmings
(74) Attorney, Agent, or Firm—Barnes & Thornburg LLP

(57) ABSTRACT

A method of performing interleaving or deinterleaving in a communication system having at least one interleaver at the transmitter and at least one deinterleaver at the receiver. The method includes interleaving or deinterleaving the input bit sequence $x_n$ as follows: $y_n = x_{\pi_n}$, n=0, . . . , N−1, using a bridge function between $\pi_n$ and n, n=0, . . . , N−1, based on a spline linear model. When the system includes a first and a second interleaving or deinterleaving, the method is performed for both. When the second interleaving or deinterleaving includes adding padding bits, the location in the interleaved or deinterleaved bit sequence of the padding bits is determined and interleaving or deinterleaving for the determined locations is skipped.

8 Claims, 2 Drawing Sheets

METHOD OF INTERLEAVING/DEINTERLEAVING IN A COMMUNICATION SYSTEM

BACKGROUND AND SUMMARY OF THE INVENTION

The present invention relates generally to communication systems of coded data and, more specifically, to an improvement in interleaving and deinterleaving of the data.

Although the present invention will be described with respect to $3^{rd}$ generation wideband code division multiple access (3G WCDMA) system, the same method can be used for interleaving and/or deinterleaving in other systems. Also for sake of brevity, the method will be described for interleavers, but is also used with deinterleavers. General and specific references will also be made to the 3G WCDMA standard 3GPP TS 25.212: "Multiplexing and channel coding (FDD)."

In communication systems, most of the well-known codes have been developed to combat against the noise that is assumed to be statistically independent. Typical channel model causing this type of noise would be AWGN (Additive White Gaussian Noise) channel. However, there are some physical channels that show bursty error characteristics, such as mutipath fading channel, in which fading often causes the signal to fall below the noise level and, thus, results in the burst type of error. For reference, see J. Proakis, Digital Communications, McGraw-Hill, 2001.

The role of interleaving is to shuffle (or to randomize) the positions of errors introduced in channels and, thus, mitigate the effects of burst type noise.

There are two channel interleavers for 3G WCDMA, namely first and second interleavers. The first interleaver takes a role of inter-frame (in transport channel) interleaving and the second interleavers for intra-frame (in physical channel) interleaving.

The classical block interleaver writes input data along the rows of a temporary matrix, and read out along the columns of the matrix. The first and second interleavers designed for CDMA are basically a block interleaver with inter-column permutations.

The present invention is a method of performing interleaving or deinterleaving in a communication system having at least one interleaver at the transmitter and at least one deinterleaver at the receiver. The method includes interleaving or deinterleaving the input bit sequence $x_n$ as follows: $y_n = x_{\pi_n}$, $n=0, \ldots, N-1$, using a bridge function between $\pi_n$ and n, n=0, ..., N-1, based on a spline linear model. The bridge function is $$\pi_n^{r_j} = C \times n - j \times N + P_C(j),$$

j=0,1, ..., C−1, where $P_C(j)$ is the permutation pattern and $r_j$ denotes the sets of discrete time intervals. Thus, the interleaving or deinterleaving is $$y_n^{r_j} = x_{C \times n - j \times N + P_C(j)},$$

$ner_j$. When the system includes a first and a second interleaving or deinterleaving, the method is performed for both. When the second interleaving or deinterleaving includes adding padding bits, the location in the interleaved or deinterleaved bit sequence of the padding bits is determined and interleaving or deinterleaving for the determined locations is skipped. Wherein y has an index m, and x has an index n, the index m is not increased, and the index n is increased for determined locations of padding.

The method can be performed without forming a matrix of the bit sequence and in software.

These and other aspects of the present invention will become apparent from the following detailed description of the invention, when considered in conjunction with accompanying drawings.

DETAILED DESCRIPTION OF THE PREFERRED EMBODIMENTS

Figure 1:
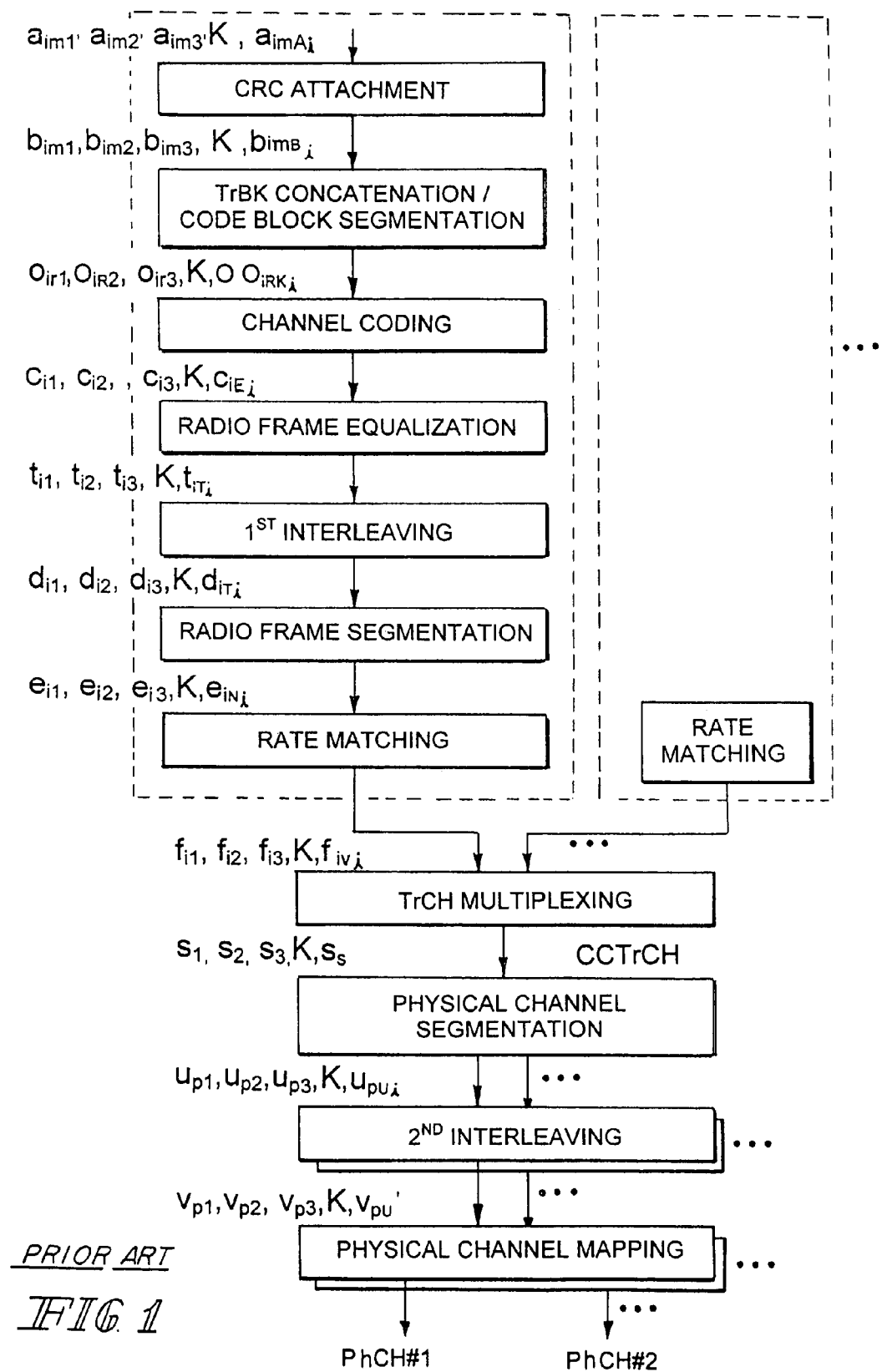
FIG. 1 is a block diagram of the transport channel procedure of the 3G WCDMA system defined in 3GPP TS 25.212.

The 3G WCDMA transmitter is shown in FIG. 1. A cycle redundant check (CRC) processes the bit sequence a and produces the CRC attached bit sequence b. A transport block (TrBk) concatenation and code block segmentation is performed before channel coding and produces o. Channel coding block produces encoded bits c. Radio frame equalization produces sequence t. There is a first interleaver whose output d is processed by radio frame segmentation and rate matching producing sequences e and f, respectively. Next, transport channel (TrCH) multiplexing produces a sequence s, which is a coded composite transport channel (CCTrCH). Next, physical channel segmentation produces sequence u, which is transmitted through a second interleaver to produce sequence v. Finally, physical channel mapping is performed to produce physical channels PhCH.

The first interleaver operation as described in the CDMA standard 3GPP TS 25.212: "Multiplexing and channel coding (FDD)" is as follows:

The input bit sequence to the first interleaver is denoted by $x_0, x_1, x_2, \ldots, x_{N-1}$, where N is the number of bits.

Here, N is guaranteed to be an integer multiple of the number of radio frames in the time transmission intervals (TTI). The output bit sequence from the block interleaver is derived as follows:

(1) Select the number of columns C from Table 1 depending on the TTI. The columns are numbered 0, 1, ..., C−1 from left to right.

(2) Determine the number of rows of the matrix, R defined as:

$R=N/C$.

The rows of the matrix are numbered 0, 1, ..., R−1 from top to bottom.

(3) Write the input bit sequence into the R×C matrix row by row:

$$\begin{bmatrix} x_0 & x_1 & x_2 & \cdots & x_{C-1} \\ x_C & x_{C+1} & x_{C+2} & \cdots & x_{2\times C-1} \\ \vdots & \vdots & \vdots & \cdots & \vdots \\ x_{(R-1)\times C} & x_{(R-1)\times C+1} & x_{(R-1)\times C+2} & \cdots & x_{R\times C-1} \end{bmatrix}$$

(4) Perform the inter-column permutation for the matrix based on the pattern $<P_C(j)>_{j \in \{0,1,\ldots,C-1\}}$ shown in Table 1, where $P_C(j)$ is the original column position of the j-th permuted column. After permutation of the columns, the bits are denoted by $\{y_n\}_{n=0}^{N-1}$:

$$\begin{bmatrix} y_0 & y_R & y_{2\times R} & \cdots & y_{(C-1)\times R} \\ y_1 & y_{R+1} & y_{2\times R+1} & \cdots & y_{(C-1)\times R+1} \\ \vdots & \vdots & \vdots & \cdots & \vdots \\ y_{R-1} & y_{2\times R-1} & y_{3\times R-1} & \cdots & y_{C\times R-1} \end{bmatrix}$$

(5) Read the output bit sequence $y_0, y_1, y_2, \ldots, y_{C\times R-1}$ of the block interleaver column by column from the inter-column permuted R×C matrix.

TABLE 1

Inter-column permutation patterns for 1st interleaving

| TTI | Number of columns C | Inter-column permutation patterns $<P_C(0), P_C(1), \ldots, P_C(C-1)>$ |
|---|---|---|
| 10 ms | 1 | <0> |
| 20 ms | 2 | <0, 1> |
| 40 ms | 4 | <0, 2, 1, 3> |
| 80 ms | 8 | <0, 4, 2, 6, 1, 5, 3, 7> |

The second interleaver is also a block interleaver, and its structure and interleaver operation are similar to the first interleaver, except that it uses a fixed number of columns for forming interleaver matrix and has to handle padding and pruning dummy bits. Those dummy bits are required if input bit size is not a multiple of the number of columns in the second interleaver.

The second interleaver operation as described in the CDMA standard 3GPP TS 25.212: "Multiplexing and channel coding (FDD)" is as follows:

Let the input bit sequence of size M to the second interleaver is denoted by $\{u_m\}_{m=0}^{M-1}$.

(1) Assign the number of columns of the interleaver matrix, C2, as C2=30.
(2) Determine the number of rows of the matrix, R2, by $$R2 = \left\lceil \frac{M}{C2} \right\rceil,$$

where $\lceil . \rceil$ denotes the ceiling operation.

(3) Write the input bit sequence $u_0, u_1, \ldots, u_{M-1}$ into the R2×C2 matrix row-by-row starting with bit $y_o$ in column 0 of row 0:

$$\begin{bmatrix} y_0 & y_1 & y_2 & \cdots & y_{C2-1} \\ y_{C2} & y_{C2+1} & y_{C2+2} & \cdots & y_{2\times C2-1} \\ \vdots & \vdots & \vdots & \cdots & \vdots \\ y_{(R2-1)\times C2} & y_{(R2-1)\times C2+1} & y_{(R2-1)\times C2+2} & \cdots & y_{R2\times C2-1} \end{bmatrix}$$

where $y_k = u_k$ for $k=0,1,2,\ldots,M-1$ and if R2×C2>M, the dummy bits are padded such that $y_k=0$ or 1 for $k=M, M+1,\ldots,R2\times C2-1$. These dummy bits are pruned away from the output of the matrix after the inter-column permutation.

(4) Perform the inter-column permutation for the matrix based on the pattern $<P2(j)>_{j \in \{0,1,\ldots,C2-1\}}$ that is shown in table 2, where P2(j) is the original column position of the j-th permuted column. After permutation of the columns, the bits are denoted by $y'_k$.

$$\begin{bmatrix} y'_0 & y'_1 & y'_2 & \cdots & y'_{C2-1} \\ y'_{C2} & y'_{C2+1} & y'_{C2+2} & \cdots & y'_{2\times C2-1} \\ \vdots & \vdots & \vdots & \cdots & \vdots \\ y'_{(R2-1)\times C2} & y'_{(R2-1)\times C2+1} & y'_{(R2-1)\times C2+2} & \cdots & y'_{R2\times C2-1} \end{bmatrix}$$

(5) The output of the block interleaver is the bit sequence read out column by column from the inter-column permuted R2×C2 matrix. The output is pruned by deleting dummy bits that were padded to the input of the matrix before the inter-column permutation, i.e. bits $y'_k$ that corresponds to bits $y_k$ with k>M are removed from the output.

TABLE 2

Inter-column permutation pattern for 2nd interleaving

| Number of columns C2 | Inter-column permutation pattern $<P2(0), P2(1), \ldots, P2(C2-1)>$ |
|---|---|
| 30 | <0, 20, 10, 5, 15, 25, 3, 13, 23, 8, 18, 28, 1, 11, 21, 6, 16, 26, 4, 14, 24, 19, 9, 29, 12, 2, 7, 22, 27, 17> |

Figure 2:
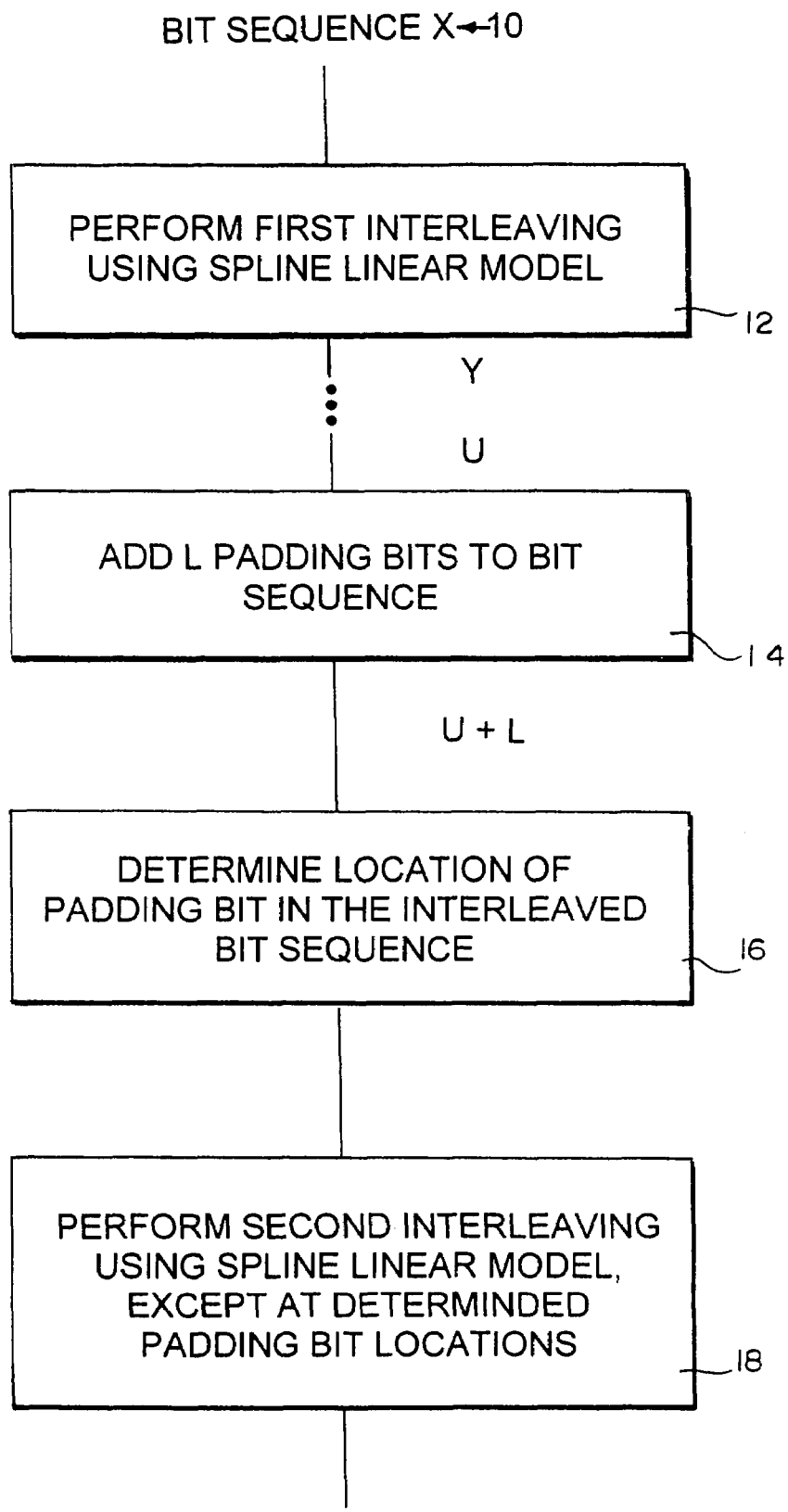
FIG. 2 is a flow chart of a method of first/second interleaving incorporating the principles of the present invention.

The method, as illustrated in FIG. 2, begins with the bit sequence X at input 10. The first interleaving is performed using a spline linear model at 12. The interleaved bit sequence is Y. After other processing, a second interleaving may be performed. The bit sequence U has L bits added at 14. Next, there is a determination of the location of the padding bits in the second interleaved bit sequence at 16. Then, a second interleaving is performed using the spline linear model, except at the determined bit locations at 18. The resulting bit sequence V is outputted at 20. The specific process of performing the first and second interleaving is described in the following.

The method for the interleaving is performed in software and without forming an actual matrix of the bit sequence. It is uses a bridge function base on a spline linear model.

Let $$\{\pi_n\}_{n=0}^{N-1}$$

denote the original input bit position of the n-th interleaved bit position. Then the interleaver operation can be described as $y_n = x_{\pi_n}$, $n=0, \ldots, N-1$ having a bridge function between $\pi_n$ and $n$, $n=0, \ldots, N-1$, based on a spline linear model. The bridging function can be defined as $$\pi_n^{r_j} = \alpha^{r_j} n + \beta^{r_j},$$

where $n=0,1,2,\ldots, N-1$, and $\{r_j: j=0,1,2,\ldots C-1\}$ denote the sets of discrete time intervals, $$r_0 = \left\{0, 1, 2, \ldots, \frac{N}{C} - 1\right\}, \quad (1)$$

$$r_1 = \left\{\frac{N}{C}, \frac{N}{C} + 1, \frac{N}{C} + 2, \ldots, \frac{2N}{C} - 1\right\},$$

$$\vdots$$

$$r_{C-1} = \left\{\frac{(C-1)N}{C}, \frac{(C-1)N}{C} + 1, \frac{(C-1)N}{C} + 2, \ldots, N - 1\right\}.$$

For each $r_j$, the parameters $\alpha^{r_j}$ and $\beta^{r_j}$ are obtained as:

$\alpha^{r_j} = C$, $\forall j$, $\beta^{r_j} = -j \times N + P_C(j)$.

That is, $\pi_n$, regress over n by the following relation:

$$\pi_n^{r_j} = C \times n - j \times N + P_C(j), \; j = 0, 1, \ldots, C-1. \quad (2)$$

Now with the calculation of index in equation (2), the interleaving can be done by:

$$y_n^{r_j} = x_{C \times n - j \times N + P_C(j)}, \; n \in r_j. \quad (3)$$

The second interleaver can be designed in the same way that the first interleaver is designed. However, since the dummy bit padding and pruning have to be considered, in addition to equation (3), another step is necessary. The location of the padding bits in the sequence needed to be identified and interleaving not performed at those locations.

Let $D_d$ and d denote a set of dummy bit positions and the number of dummy bits, respectively. That is, $D_d = \{R2 \times C2 - 1, R2 \times C2 - 2, \ldots, R2 \times C2 - d\}$, if $1 \leq d \leq 29$. Note that if $M = R2 \times C2$, then $D_d$ becomes an empty set.

Let $$D_d^{shuffle}$$

be modified $D_d$ after column permutation in Table 2.

For the 3GPP second interleaver, the $$D_d^{shuffle}$$

conditioned on d is given by, $$D_0^{shuffle} = \{empty\}, \quad (4)$$

$$D_1^{shuffle} = \{R2 \times 24 - 1\},$$

$$D_2^{shuffle} = \{R2 \times 12 - 1, R2 \times 24 - 1\},$$

$$D_3^{shuffle} = \{R2 \times 12 - 1, R2 \times 24 - 1, R2 \times 29 - 1\},$$

$$\vdots$$

$$D_{29}^{shuffle} = \{R2 \times 2 - 1, R2 \times 3 - 1, \ldots, R2 \times 30 - 1\}.$$

Basically, the second interleaving can be done by equation (3), but because of dummy bits, another time index is required. One type of index, say m, is used for writing interleaved bits, and the other, say n, is for reading the input bits. Let U' denote the zero padded input sequence to the $2^{nd}$ interleaver.

If the dummy bit size is d, the proposed second interleaving procedure is as follows:

1. Set the modified position vector, $$D_d^{shuffle} = \{R2 \times k_1 - 1, \ldots, R2 \times k_d - 1\},$$

where $k_1 = 24$, $k_2 = 12$, $k_3 = 29$, $\ldots$.

2. If $$n \notin D_d^{shuffle},$$

interleave $v_m$ by $$v_m^{r_j} = u'_{C2 \times n - j \times C2 \times R2 + P_{C2}(j)},$$

$$0 \leq m < M, \; 0 \leq n < (C2 \times R2), \text{ and} \quad (5)$$

$$r_0 = \{0, 1, 2, \ldots, R2 - 1\},$$

$$r_1 = \{R2, R2 + 1, R2 + 2, \ldots, 2 \times R2 - 1\},$$

$$\vdots$$

$$r_{C2-1} = \{(C2 - 1) \times R2, (C2 - 1) \times R2 + 1, \ldots, C2 \times R2 - 1\}.$$

3. If $$n \in D_d^{shuffle},$$

skip interleaving and do not increase the interleaved array index m while increase n.

Although the present invention has been described and illustrated in detail, it is to be clearly understood that this is done by way of illustration and example only and is not to be taken by way of limitation. The first interleaver has an input sequence x and an output sequence y, and the second interleaver has an input sequence u and an output sequence v. With respect to the claims, both interleavers will use the same x,y notation. The spirit and scope of the present invention are to be limited only by the terms of the appended claims.

What is claimed:

1. A method of performing interleaving or deinterleaving in a communication system having at least one interleaver at the transmitter and at least one deinterleaver at the receiver, the method being performed in software by the interleaver or in the transmitter deinterleaver in the receiver and comprising:

receiving by the interleaver or deinterleaver an input bit sequence $X_n$;

interleaving or deinterleaving the input bit sequence $X_n$ as follows: $y_n = x_{\pi_n}, n=0, \ldots, N-1$, using a bridge function between $\pi_n$ and $n$, $n=0, \ldots, N-1$, based on a spline linear model without forming a matrix of the bit sequence for permutation interleaving or deinterleaving; and outputting from the interleaver or deinterleaver the interleaved or deinterleaved bit sequence.

2. The method of claim 1, wherein the bridge function is $$\pi_n^{r_j} = C \times n - j \times N + P_C(j),$$

$j=0,1, \ldots, C-1$, where $P_C(j)$ is the permutation pattern and $r_j$ denote the sets of discrete time intervals, and the interleaving or deinterleaving is $$y_n^{r_j} = x_{C \times n - j \times N + P_C(j)}, n \in r_j.$$

3. The method of claim 1, wherein the system includes a first and a second interleaving or deinterleaving and the method is performed for both.

4. The method of claim 3, wherein the second interleaving or deinterleaving includes:

adding padding bits;

determining the location in an interleaved or deinterleaved bit sequence of the padding bits; and skip interleaving or deinterleaving for the determined locations.

5. The method of claim 4, wherein y has an index m, and x has an index n; and the index m is not increased, and the index n is increased for determined locations of padding.

6. The method of claim 1, wherein the interleaving or deinterleaving includes:

adding padding bits;

determining the location in an interleaved or deinterleaved bit sequence of the padding bits; and skip interleaving or deinterleaving for the determined locations.

7. The method of claim 6, wherein y has an index m, and x has an index n; and the index m is not increased, and the index n is increased for determined locations of padding.

8. An apparatus including an interleaver or deinterleaver performing the method of claim 1.

* * * * *